United States Patent [19]

Neumann et al.

[11] Patent Number: 4,532,888

[45] Date of Patent: Aug. 6, 1985

[54] ELECTRON-BEAM COATING OF VERY BROAD STRIPS

[75] Inventors: Manfred Neumann; Henry Morgner; Harry Förster; Günter Jäsch; Wilfried Kunack; Martin Godenschweg; Peter Ungänz, all of Dresden, German Democratic Rep.

[73] Assignee: Bakish Materials Corp., Englewood, N.J.

[21] Appl. No.: 518,473

[22] Filed: Jul. 29, 1983

[30] Foreign Application Priority Data

Aug. 3, 1982 [DD] German Democratic Rep. .................................. 2422022

[51] Int. Cl.³ .............................................. C23C 13/12
[52] U.S. Cl. .................................... 118/718; 118/726; 219/121 EE; 219/121 EV; 427/42
[58] Field of Search ..................... 373/13, 14; 427/42; 118/726, 727, 718; 219/121 EF, 121 EG, 121 EN, 121 ET, 121 ES, 121 EL, 121 EE, 121 EV

[56] References Cited

U.S. PATENT DOCUMENTS

| | | | |
|---|---|---|---|
| 3,046,936 | 7/1962 | Simons, Jr. ...................... | 118/726 X |
| 3,814,829 | 6/1974 | Mouchan et al. ............. | 219/121 EE |
| 3,931,490 | 1/1976 | Grothe et al. .................. | 118/726 X |
| 4,327,273 | 4/1982 | Kita et al. ...................... | 219/121 ES |
| 4,398,079 | 8/1983 | Dard et al. ..................... | 219/121 EN |

*Primary Examiner*—John D. Smith
*Assistant Examiner*—Bernard F. Plantz
*Attorney, Agent, or Firm*—Nolte, Nolte and Hunter

[57] ABSTRACT

Electron-beam (EB) coating of broad strips with improved film quality, and without undue scattering and deflection of the electron beam at long beam paths is accomplished with a shielding mantle, placed between the EB gun and the evaporation crucible, providing vacuum-tight shielding of the beam path from the coating chamber.

7 Claims, 2 Drawing Figures

ELECTRON-BEAM COATING OF VERY BROAD STRIPS

FIELD OF THE INVENTION

The present invention relates to electron-beam coating of very broad strips, by means of an evaporation crucible placed across the direction of strip movement. This arrangement is preferably used for coating strips of paper, plastics or metals, but the invention is also suitable for coating of other substrates, moved over the evaporator instead of the strip.

PRIOR ART

Board strips are conventionally coated by electron-beam equipment from an evaporation crucible extended across the direction of strip movement. Several methods are known for the necessary deflection of the electron beam. The axis of the electron-beam (EB) gun can be arranged like the evaporation crucible across the direction of the strip run. This solution is inappropriate for the coating of very broad strips, however, because the electron beam has to pass through a portion of the vapor stream over a substantial distance, and is thereby attenuated too much for effective coating.

Another solution places the EB gun parallel with the direction of the strip run, i.e. vertically to the evaporation crucible. In this case the beam paths in the space with vapor particles are not as long, but for coating very broad strips very high deflection amplitudes and, thus, due to the limited deflection angle, very long beam paths between the EB gun and the evaporation crucible are required. With such long beam paths, the electron beam is scattered by molecules of gas desorbed from the material to be coated, and from heated parts of the coating chamber. Thus, the power densities required for evaporation can't be obtained at the surface of the evaporation crucible.

Similar problems arise if the EB gun is arranged at an angle to the direction of the strip run with a magnetic sector field interposed between the EB gun and the evaporation crucible. In this case, also, the beam paths are very long and, thus, power densities for the deposition at the opposite strip side are insufficient. Furthermore, at a relatively long beam path from the EB gun to the sector field results in uncontrollable deflections of the electron beam, due to stray magnetic fields, so that the electron beam can miss the relatively narrow duct between the pole shoes of the sector field.

OBJECTS OF THE INVENTION

It is the principal object of the present invention to provide a means for electron-beam coating that enables very broad strips to be coated without impairing film quality at the strip edges, and with a high energetic efficiency.

Various other objects and advantages of the invention will become apparent from the following description of embodiments, and the novel features will be particularly pointed out in connection with the appended claims.

THE DRAWINGS

Reference will hereinafter be made to the accompanying drawings, wherein:

FIG. 1 is a simplified, schematic, perspective view illustrating the invention with the EB gun located vertically above and normal to the length of the evaporation crucible; and FIG. 2 is a view similar to FIG. 1, but with the EB gun located above and at an angle to the evaporation crucible.

DESCRIPTION OF EMBODIMENTS

Figure 1:
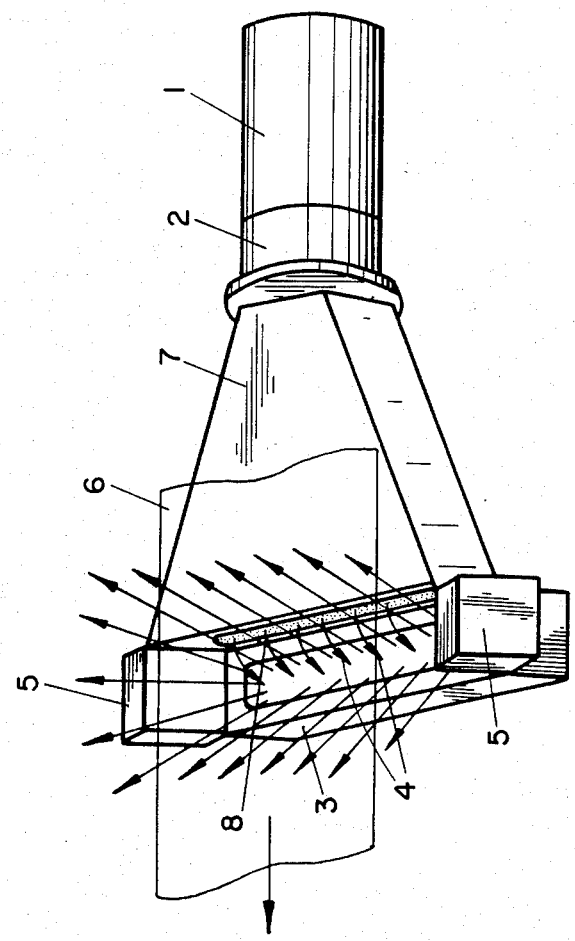

The present invention, in its essential part, provides an arrangement that prevents undue scattering or faulty deflection of the electron beam, on its way from the EB gun to the evaporation crucible.

According to the invention, the electron beam is shielded from the coating chamber between the EB gun and the evaporation crucible with a shielding mantle, vacuum-tight in the machine. The shielding mantle extends to the vapor stream above the evaporation crucible.

This arrangement allows beam paths of 2 to 3 meters length, when high-power electron beam guns with an accelerating voltage of about 30 kV are used. Without this shielding, the beam is only able to cover a distance of 1 meter at the most, without being scattered too much, because of the relatively high residual gas pressure in the coating chamber. A notable feature is that no additional vacuum pumps have to be connected to the shielding mantle. It is believed that the vapor stream of evaporating material in effect forms a barrier against the penetration of residual gas from the coating chamber into the shielding mantle. It is possible that the vapor stream does not only act as a barrier, but itself works as a pump clearing the residual gas from inside the shielding mantle. By impacts with the directed vapor stream, particles of the residual gas are exhausted from the outlet region of the shielding mantle and into the coating chamber.

The shielding mantle may be either a non-magnetizing or magnetically soft material, depending on the type of beam guidance between the EB gun and the evaporation crucible. If the EB gun is placed normally to the evaporation crucible, the shielding mantle consists of non-magnetizing material. This prevents short-circuits of the magnetic deflection field existing above the evaporation crucible normal to the direction of strip movement.

If the EB gun is arranged at an angle to the crucible, and a magnetic sector field is required for beam guidance, it is advantageous to make the walls of the shielding mantle from a magnetically soft material for shielding the stray magnetic fields. The pole shoe plates of the magnetic sector field will act as a part of the shielding mantle in this case. To avoid a magnetic short circuit of the pole shoe plates, they are separated from each other and from the residual parts of the shielding mantle by gaps filled with a non-magnetic material.

Furthermore, it is preferred to provide a magnetically soft yoke with an exciting coil on it, between a pole shoe plate and the residual part of the shielding mantle, so that the magnetic potential difference between each of the two pole shoe plates and the residual part of the shielding mantle is equal, with an opposite polarity. This is necessary to prevent an unwanted vertical deflection of the beam entering the magnetic sector field, if very broad strips are coated and the electron beam is deflected by a correspondingly large angle.

In spite of this symmetrical construction, beam distortions can occur at very great deflection angles, due to the angular intake of the electron beam into the magnetic sector field. These distortions are avoided if the gap between the pole shoe plates of the sector field and the residual part of the shielding mantle bend towards the EB gun in concave fashion. Thus, the electron beam intersects this gap almost vertically even at great deflection angles. But in this case the incidence line of the electron beam at the evaporation crucible, too, is bent to a greater extent. To avoid this bending at very great deflection angles, too, the gap between the pole shoes of the sector field and the residual part of the shielding mantle should have a convex bend towards the EB gun. With exact placement of the electron paths, the convex form of the gap arises from the demand that at very high deflection angles, the electron beam must always leave the magnetic sector field at the same angle. Thus, for the purpose of coating very broad strips the choice of a straight, of a concave or of a convex form of the gap between the pole shoes of the sector field and the residual part of the shielding mantle will depend on which parameters of the electron-beam coating facility the greatest store is set by, according to the particular application.

Referring now to the drawings, in FIG. 1 the electron beam 4 generated in an EB gun 1 and deflected by the a.c. field of the first beam deflection system 2 over the whole length of the evaporation crucible 3 is guided to the surface of the evaporation crucible 3 by the d.c. field of the second beam deflection system 5. The vapor stream of the evaporating material impinges on the strip 6 to be coated that is lead parallel with the axis of the EB gun 1, above the evaporation crucible 3. Between the EB gun 1 and the evaporation crucible 3 a shielding mantle 7 is assembled, being vacuum-tight from every point of view, and the outlet 8 of which is closed by the vapor stream. The shielding mantle 7 consists of a non-magnetizing material for preventing a short circuit of the d.c. field of the second beam deflection system 5.

Figure 2:
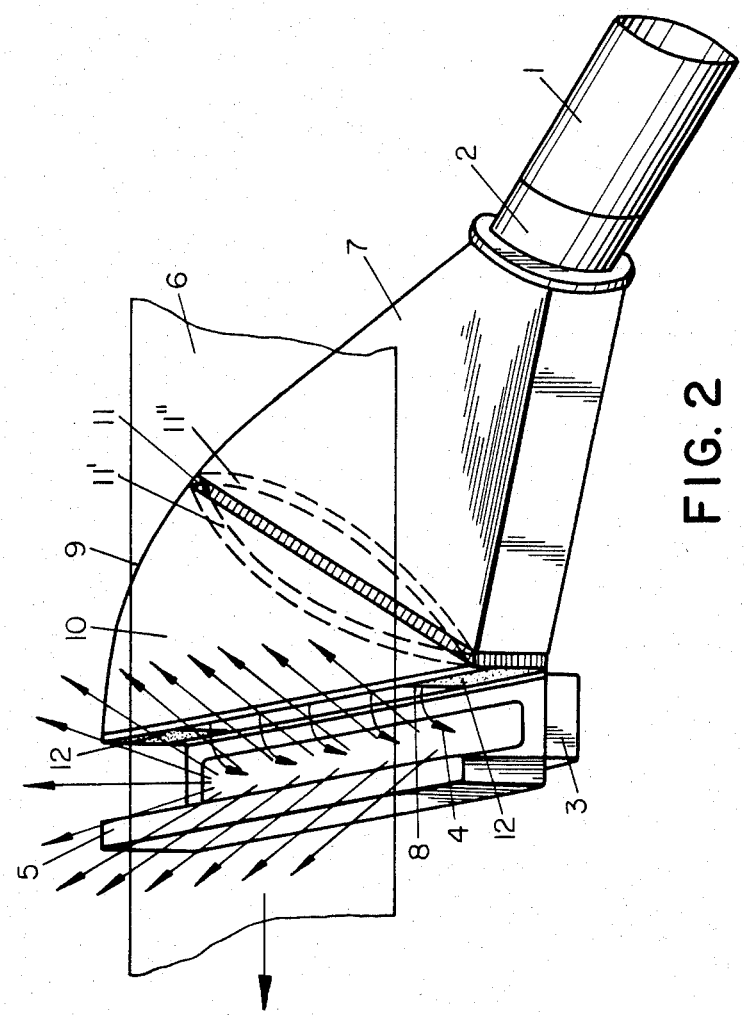

In FIG. 2, the EB gun 1 is placed at an angle to the evaporation crucible 3. A known magnetic sector field caused by a third beam deflection system 9 localized between them ensures that the electron beam 4 enters the d.c. field of the second beam deflection system 5, guiding the electron beam 4 to the surface of the evaporation crucible, at the same angle at each point. The vacuum tight shielding mantle 7 between the crucible 3 and the deflection system 2 comprises the pole shoe plates 10 of the third beam deflection system 9. The residual part of mantle 7 between pole shoe plates 10 and first beam deflection system 2 consists of a magnetically soft material to shield the stray magnetic fields that could cause the electron beam to miss the relatively narrow duct between the pole shoe plates 10 of the sector field 9. Between the pole shoe plates 10 of the third beam deflection system 9 and the residual part of the shielding mantle 7, a gap 11 with a width of some millimeters is filled with a non-magnetizing material for vacuum-tightness. This non-magnetizing material prevents short circuits of the third beam deflection system with the residual part of the shielding mantle 7. For complete vacuum tightness of shielding mantle 7 from the surrounding coating chamber, the gap 12 between the pole shoe plates 10 of the third beam deflection system 9 is also filled with non-magnetizing material at the outer sides, whereas the outlet 8 of the shielding mantle 7 between the pole shoe plates 10 of the third beam deflection system 9 is closed by the vapor stream when the device operates. The lower pole shoe plate 10 of the third beam deflection system 9 is connected with the residual part of the shielding mantle 7 by a magnetically soft yoke 13 with an exciting coil 14. Thus, the magnetic potential difference between each of the pole shoe plates 10 of the magnetic sector field 9, and the residual part of the shielding mantle 7 can be set to an equal and opposite value. The figure also shows the suitable form of the gap 11 between the pole shoe plates 10 of the third beam deflection system 9 and the residual part of the shielding mantle 7 for the cases that while coating very broad strips 6 at the border of the evaporation crucible 3, the electron beam is either distorted or shifted too much. At too great beam distortions a gap 11' concave towards the EB gun 1, and at too great beam shiftings at the border, i.e. if the incidence line of the electron beam 4 at the evaporation crucible 3 is bent too much, a gap form 11'' convex towards the EB gun 1 is suitable.

Various changes in the details, steps, materials and arrangements of parts, which have been herein described and illustrated in order to explain the nature of the invention, may be made by those skilled in the art, within the principle and scope of the invention as defined in the appended claims.

What is claimed is:

1. Apparatus for electron-beam coating of broad strips comprising:
   an elongated evaporation crucible;
   means for transporting strip to be coated over said crucible in a direction normal to the long side thereof;
   an electron gun above said crucible and spaced from said long side;
   a first beam deflection system for spreading said beam;
   a vacuum-tight beam shielding mantle extending from said first deflection means to said crucible;
   a second beam deflection system for deflecting a beam emergent from said mantle downward into said crucible;
   said mantle extending to the path of material vaporized from said crucible, so that the outlet of it is closed by the vapor stream.

2. The apparatus as claimed in claim 1, wherein said gun is normal to the long side of said crucible, and said mantle is non-magnetic.

3. The apparatus as claimed in claim 1, wherein said gun is at an angle of less than 90° to the long side of said crucible, said mantle comprises the pole shoe plates of a third beam deflection system adapted to bend said angled beam to enter the second beam deflection system at the same angle at each point, and the residual part of said mantle consists of a soft magnetic material.

4. The apparatus as claimed in claim 3, wherein said pole shoe plates establish a magnetic sector field within said mantle, said plates being insulated from the residual part of said mantle by non-magnetic material.

5. The apparatus as claimed in claim 4, wherein said non-magnetic material defines a gap that is straight.

6. The apparatus as claimed in claim 4, wherein said non-magnetic material defines a gap that is concave.

7. The apparatus as claimed in claim 4, wherein said non-magnetic material defines a gap that is convex.

* * * * *